United States Patent [19]
Takekawa

[11] Patent Number: 5,357,400
[45] Date of Patent: Oct. 18, 1994

[54] TAPE AUTOMATED BONDING SEMICONDUCTOR DEVICE AND PRODUCTION PROCESS THEREOF

[75] Inventor: Koichi Takekawa, Tokyo, Japan

[73] Assignee: NEC Corporation, Tokyo, Japan

[21] Appl. No.: 981,233

[22] Filed: Nov. 25, 1992

[30] Foreign Application Priority Data

Nov. 26, 1991 [JP] Japan .................................. 3-336345

[51] Int. Cl.$^5$ .............................................. H05H 7/20
[52] U.S. Cl. .................................... 361/704; 174/254; 174/259; 228/180.1; 257/668; 257/700; 257/707; 257/712; 361/749
[58] Field of Search ................ 174/52.4, 51, 254, 255, 174/259, 268; 228/180.2; 257/659–660, 668, 700, 707, 712, 670, 676, 698; 361/392, 398, 421

[56] References Cited

U.S. PATENT DOCUMENTS 3,689,991  9/1972  Aird .
5,036,380  7/1991  Chase .................................. 257/668

FOREIGN PATENT DOCUMENTS 62-46537  2/1987  Japan .

OTHER PUBLICATIONS

IBM Tech. Dis. Bulletin "Plane Electrical Enhancement", vol. 32, No. 10, Mar. 1990, pp. 85–86.
"TAB Tames High–Density Chip I/Os" by Howard W. Markstein, E P and P, Dec. 1988.

*Primary Examiner*—Gregory D. Thompson

[57] ABSTRACT

A TAB(tape automated bonding) device is provided with a multi-metal-layer film tape for each semiconductor chip. Two parallel grounding conductor layers and a power supply conductor layer sandwiched between the two grounding conductor layers are formed in the multi-metal-layer film tape, and grounding leads which are connected to grounding terminals of the semiconductor chip are connected to the grounding conductor layer, and power supply leads which are connected to power supply terminals of the chip are connected to the power supply conductor layer.

11 Claims, 5 Drawing Sheets

TAPE AUTOMATED BONDING SEMICONDUCTOR DEVICE AND PRODUCTION PROCESS THEREOF

BACKGROUND OF THE INVENTION

This invention relates to a tape automated bonding-(abbreviated to TAB) semiconductor device.

Since the invention of A. D. Aird disclosed in a U.S. Pat. No. 3,689,991 in 1972, TAB has been widely used in applications requiring chip connections beyond the capabilities of wire bonding.

In these heretofore known TAB semiconductor devices, a film carrier tape has sprocket holes for positioning, and device holes for placing semiconductor chips. A semiconductor chip is placed in each device hole.

A group of lead conductors are formed on the film carrier tape for each semiconductor chip. One end of each lead conductor of the group of lead conductors is connected to a bump on the semiconductor chip by inner lead bonding process (abbreviated to ILB). The opposite end of each lead conductor is terminated at a test pad on the film carrier tape. Probes of a test instrument come in contact with the test pads, and the properties of the semiconductor chip are tested.

The lead conductors of a semiconductor chip which is not rejected at the test, are cut off at outer lead bonding(abbreviated to OLB) lead holes provided in the film carrier tape surrounding the device hole.

In order to cover allowable positioning error in the test of the chip, the area of the test pad must be larger than a certain limit, and the spacing between adjacent test pads must be larger than a certain limit. For example, this spacing must be larger than 0.3 mm.

It becomes more difficult to meet these requirements when the total number of lead conductors connected to a chip becomes larger.

When a test pad is positioned at a distance from the chip, a large area may be allotted for the test pad. But this distance makes the length of the lead conductor long, and the longer lead conductor causes a larger conductor resistance which results in a larger signal delay.

In order to solve these problems, a special circuit board for testing has been proposed in a Japanese laid open publication Shou 62-46537. But, the bonding to the special circuit board for testing is troublesome, and does not solve any problem in TAB itself.

In a method introduced by Electronic Packaging & Production (1988 December pp 42~44), a grounding layer is formed on the back surface of the film carrier tape, and grounding leads of the lead conductors on the face of the film carrier tape are connected to this grounding conductor layer via through connections provided in the tape. This type of tape is called a two-metal-tape, as metal layers are formed on both sides of the insulator film, and is helpful for impedance matching of lead conductors.

In order to reduce the total number of lead conductors and that of test pads, however, a multi-metal-tape is required, and it is not practical to provide more than two metal layers in this configuration.

A TAB semiconductor chip is connected to a printed circuit board using bonding pads provided on the printed circuit board. The ends of the lead conductors of the TAB semiconductor chip are aligned on corresponding bonding pads and temporarily fixed by adhesive force of solder paste which is pasted on the bonding pads. Then, the printed circuit board with semiconductor chips is put in a reflow oven to melt the solder of the solder paste. After the melted solder is cooled and solidified, the lead conductors remain connected to the bonding pads.

For this process of OLB, co-planarity of tile surfaces of the lead conductors is important. Heretofore known TAB semiconductor devices do not have sufficient co-planarity of the lead conductor surfaces.

The TAB lead conductors are made of Cu family of 35 $\mu$m thickness, and have inferior mechanical strength compared with conventional lead conductors made of Fe, Ni family of 125 $\mu$m thickness. The TAB lead conductors are supported by a suspender made of insulator frame. But the suspender itself is a polyimide film of about 125 $\mu$m thickness and the reinforcement by the suspender is not sufficient, and often the suspender becomes warped and impairs the co-planarity.

BRIEF DESCRIPTION OF THE INVENTION

Therefore, an object of the present invention is to provide TAB semiconductor devices having a large number of ILB lead conductors and having, as well, a sufficient area for test pads with short lead conductors.

Another object of this invention is to reduce the voltage drop in the power supply to the semiconductor device.

Still another object of this invention is to prevent the power supply line from external noise interference.

Still another object of this invention is to reinforce the rigidity of the lead conductors in the vicinity of OLB lead holes.

And, still another object of this invention is to provide means for radiating heat which is generated in the semiconductor devices.

For these objects, a multi-metal-layer film tape is mounted on the film carrier tape surrounding each device hole.

This multi-metal-layer film tape has one or two grounding conductor layers and a power supply conductor layer. All the grounding leads and all the power supply leads of a group of lead conductors for a semiconductor chip, are connected to the grounding conductor layer or the power supply conductor layer. This reduces the total number of lead conductors to be terminated at test pads.

Low resistance grounding conductor layers and a low resistance power supply conductor layer reduce the voltage drop at the semiconductor chip. And since the power supply conductor layer is sandwiched between the two grounding conductor layers, the power supply conductor layer is effectively shielded from noise interferences.

The rigidity of the lead conductors is reinforced by the existence of the multilayer circuit board.

A cap and a heat sink may be connected to a multi-metal-layer film tape for heat radiation.

According to this invention, a TAB semiconductor device comprises: a longitudinally extending film carrier tape made of an insulating film having sprocket holes for positioning, and an array of plural sets of a device hole and a multilayer circuit board; wherein each set of a device hole and a multilayer circuit board comprises: a device hole provided in the tape for housing a semiconductor chip, a set of OLB lead holes provided in the tape surrounding the device hole, a sus-pender of an insulating frame formed on the tape between the device hole and the OLB lead holes, a group of lead conductors formed on the tape and supported by the suspender, ILB means for bonding one end of each lead conductor of the group of lead conductors to a bump of the chip, a resin housing sealing the bonded surface of the chip, a multi-metal-layer film tape, having multiple number of conductor layer and fixed on the suspender, means for connecting predetermined sort lead conductors to the multiple number of conductor layer of the multi-metal-layer film tape, test pads provided on the tape for testing electrical properties of the chip, and means for terminating the other ends of the lead conductors at the test pads.

BRIEF DESCRIPTION OF THE DRAWINGS

Further objects, features, and advantages of this invention will become apparent from a consideration of the following description, the appended claims, and the accompanying drawings in which the same numerals indicate the same parts.

DETAILED DESCRIPTION OF THE PREFERRED EMBODIMENTS

Figure 1A:
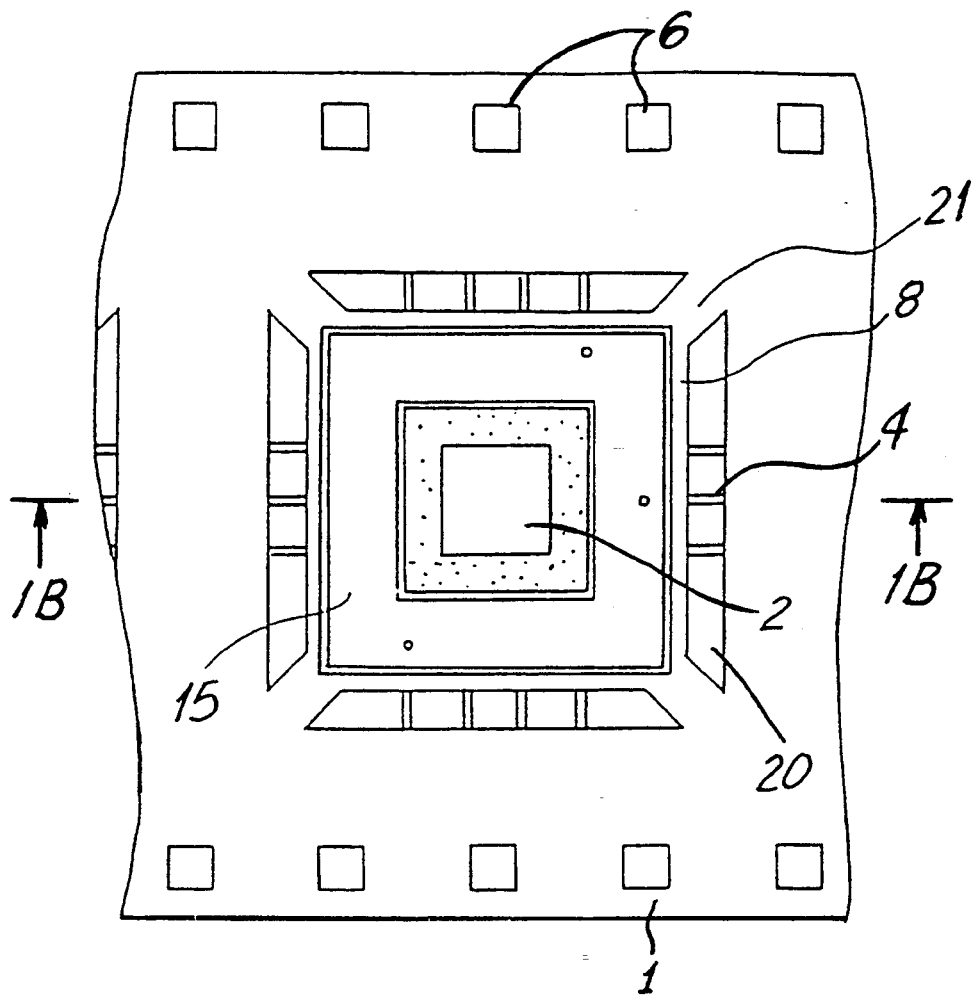
FIGS. 1A and 1B show a plan view and a cross sectional view of an embodiment of this invention.
Figure 1B:
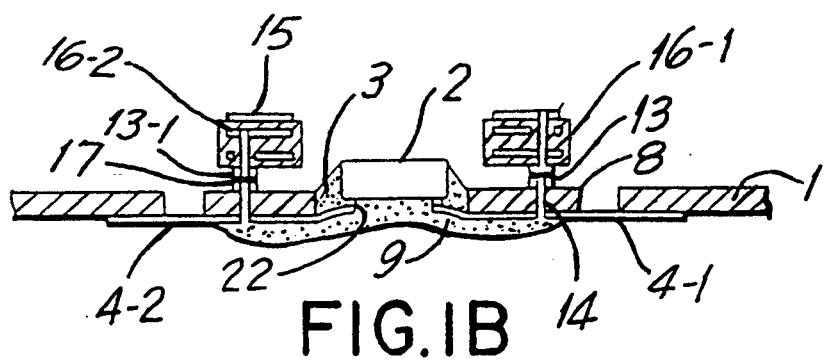

Referring to FIGS. 1A and 1B, a film carrier tape 1 for TAB is provided with sprocket holes 6, a device hole 3 for each semiconductor chip 2, a set of OLB lead holes 20 surrounding the device hole 3, a suspender 8, and lead conductors 4 having a desired pattern. The suspender 8 is an insulator frame provided between a device hole 3 and OLB lead holes 20, and supported by tie bars 21.

Each electrode terminal of the semiconductor chip 2 is bonded to a corresponding lead conductor 4 through a bump 22 formed on the pad of the electrode. After the ILB bonding, the semiconductor chip 2 is resin-sealed by resin together with the bonded portion of the lead conductors 4.

On a surface of the suspender 8, the lead conductors 4 are formed, and on the opposite surface of the suspender 8, junction pads 13 are formed. A junction pad 13 is connected to a corresponding lead conductor 4 via a through hole 14 in the suspender 8.

According to this invention, a multi-metal-layer film tape 15 having a plan view similar in shape to the suspender 8, is provided for each semiconductor chip 2. The multi-metal-layer film tape 15 has junction pads 13-1 on the base surface of the film tape at points corresponding to the position of the junction pads 13 on the suspender 8.

In order to discriminate junction pads 13 from junction pads 13-1, junction pads 13 on the suspender are called first sort junction pads 13, and the junction pads 13-1 on the multi-metal-layer film tape 15 are called second sort junction pads 13-1.

The multi-metal-layer film tape 15 is mounted on the suspender 8 with its junction pads 13-1 soldered to corresponding junction pads 13 on the suspender 8 by solder 17, connecting selected lead conductors 4 to conductor layers 16-1 or 16-2.

The conductor layer 16-1 is a grounding conductor layer, and the conductor layer 16-2 is a power supply conductor layer. Of the electrode terminals of the semiconductor chip 2, there are usually one or more than one grounding terminals and one or more than one power supply terminals. A lead conductor 4 which is connected to a grounding terminal of the semiconductor chip 2 is called a grounding lead 4-1, and a lead conductor 4 which is connected to a power supply terminal of the semiconductor chip 2 is called a power supply lead 4-2. Grounding leads 4-1 are connected to the grounding conductor layer 16-1, and power supply leads 4-2 are connected to the power supply conductor layer 16-2.

Other lead conductors 4 are terminated at test pads formed on the film carrier tape 1.

Figure 2:
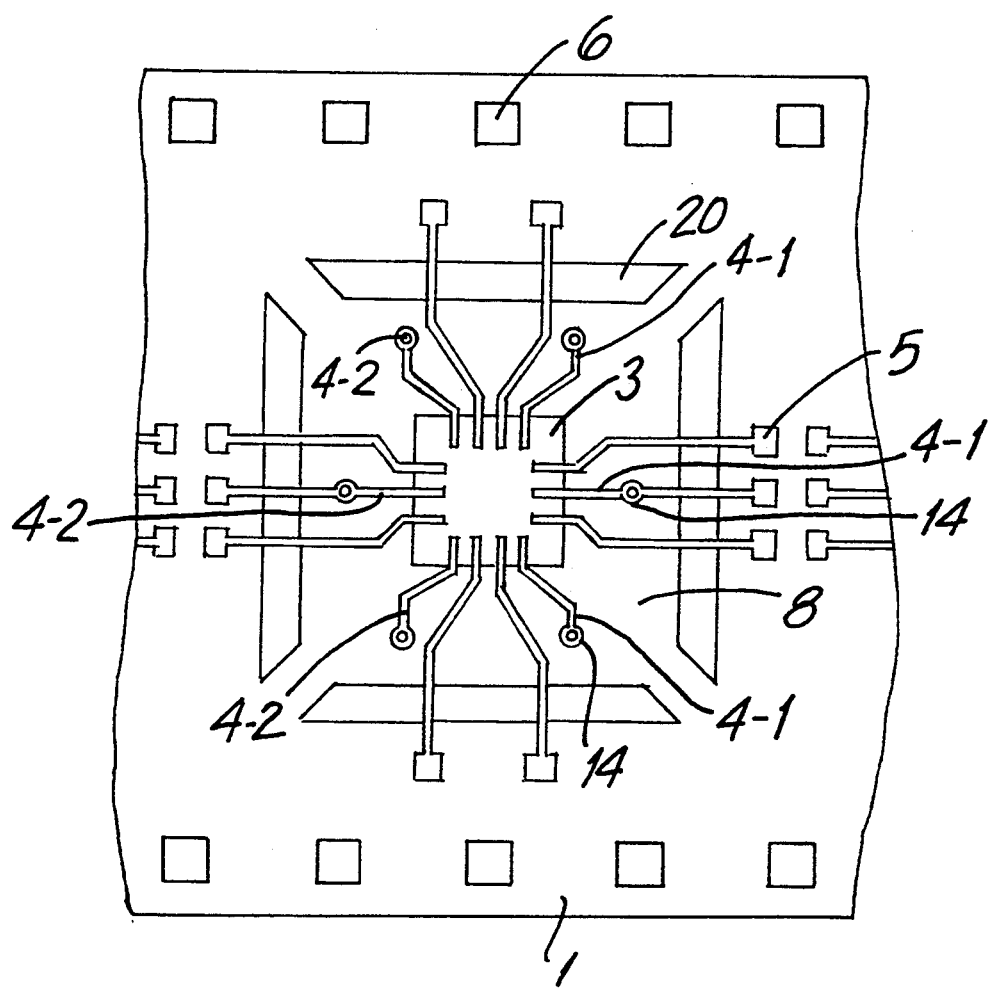
FIGS. 2 shows a plan view of the back surface of the film carrier tape of FIG. 1.

FIG. 2 shows a plan view of a surface of the film carrier tape 1, on which lead conductors 4 are formed. The grounding leads 4-1 and the power supply leads 4-2 are terminated at through holes 14, and connected to the grounding conductor layer 16-1 or to the power supply conductor layer 16-2. One and only one grounding lead 4-1 is extended and terminated at a test pad 5, and one and only one power supply lead 4-2 is extended and terminated at another test pad 5.

One of the advantages of this invention is described in connection with FIG. 2.

As shown in FIG. 2, grounding leads 4-1 and power supply leads 4-2 are connected to through connections(- not shown in the drawing) at through holes 14; and the remaining space is available for other lead conductors 4. Thus, a larger area can be allotted for test pads 5, and a wider length is allowed for the spacing of the test pads 5.

Another advantage of this invention is a reduction of voltage drop at each semiconductor chip, because of the low resistance grounding conductor layer 16-1 and the low resistance power supply conductor layer 16-2.

Still another advantage of this invention is a protection from noise interference, which is obtained by shielding of the power supply conductor layer 16-2 sandwiched between the two grounding conductor layers 16-1.

An important advantage of this invention is that a suspender 8 is reinforced in mechanical strength by the multilayer circuit board 15.

Next, the manufacturing method of the TAB semiconductor device shown in FIG. 1 is described.

The production process of the film carrier tape 1 of this invention, is similar to that of a conventional film carrier tape, and an example of the production process is briefly described.

Both surfaces of an insulating film which is made, for example, of polyimide, is covered with a thin metal film, for example, with a copper film, by evaporation or by non-electrolytic plating. Outer sprocket holes (not shown in the drawing)used for positioning in the manufacturing process, are previously provided. Through holes 14 are perforated by selective etching of the insulating tape and the metal film. Then, resist films are formed by a photoresist method on the whole surface excepting the surfaces where conductor patterns are to be formed. A metal layer, for example, a copper layer of a desired thickness of about 35 μm is generated on the conductor patterns by electro chemical plating to form the lead conductors 4. At the same time the surfaces of the through holes are plated to form through connections.

After unnecessary resist is removed, the thin metal films between the lead conductors 4 are removed by etching. Then the sprocket holes 6, the device holes 3, the OLB lead holes 20 are formed by selective etching of the polyimide film 1. The outer sprocket holes are eliminated by cutting, and the surfaces of the lead conductors 4 are plated by Au or Sn.

An example of the methods of manufacturing the film carrier tape 1 is described. It must be noted, however, that there are many different methods of manufacturing film carrier tapes, and that any of these methods may be applied to this invention.

Figure 3:
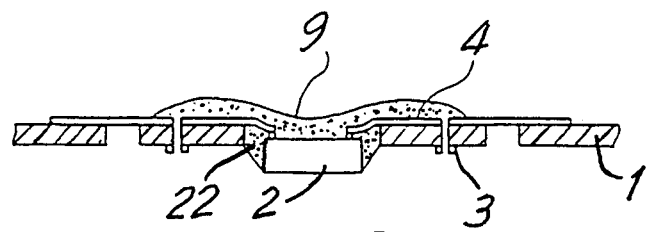
FIG. 3 is a cross sectional view illustrating resin-seal of a chip.

The ILB process of this invention is similar to a conventional process. As shown in FIG. 3, bumps 22 on the semiconductor chip 2 are bonded to corresponding lead conductors 4, and the bonded portion is resin-sealed by resin 9.

The multi-metal-layer film tape 15 is fabricated in a following process. Resin sheets of glass fiber texture impregnated by resin are used as insulating layers of the circuit board 15. Metal sheets, for example, copper sheets, are laid on both surfaces of a resin sheet. This layer of metal sheets and a resin sheet is pressed and heated. The resin is hardened and the metal sheets are adhered to the resin to form a metal covered insulating sheet. The metal sheets on both sides of the insulator sheet are selectively etched by a photoresist method to form a film tape having two layers of conductors. In a similar way, a film tape having a desired multi-metal-layers is fabricated.

Through holes 14-1 are perforated at predetermined positions by drilling or by die pressing. The surfaces of the through holes 14-1 are plated to make through connections. In a final process, the multilayer circuit board is formed to a desired shape by cutting.

Figure 4A:
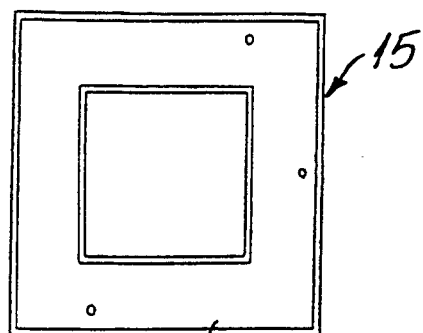
FIGS. 4A to 4C show plan views and a cross sectional view of a multilayer circuit board shown in FIG. 1.
Figure 4C:
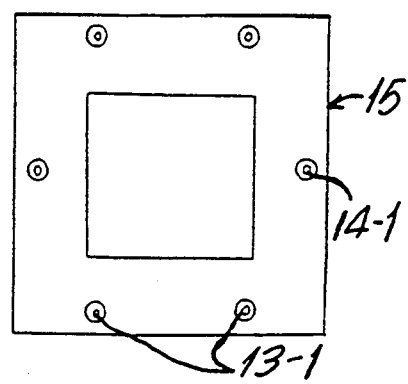
Figure 4B:
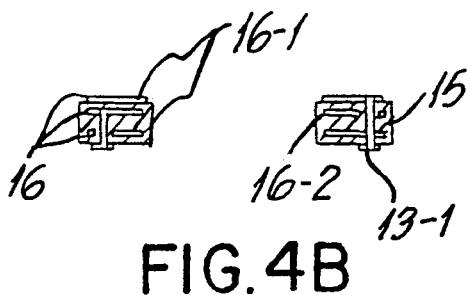

In an embodiment, the shape of the plan view of the multi-metal-layer film tape 15 is similar to that of the suspender 8. FIGS. 4A to 4C illustrates a multi-metal-layer film tape 15 thus fabricated. FIG. 4A is a top view and FIG. 4C is a bottom view, while FIG. 4B is a cross sectional view. In an embodiment shown in FIG. 4C, junction pads 13-1 are at same positions with corresponding through holes 14-1. The position of a junction pad 13-1 must be aligned to the position of a corresponding junction pad 13 on the suspender 8.

After the multi-metal-layer film tape 15 is completed, the film tape 15 is mounted on the suspender 8, and all the junction pads 13-1 are connected to corresponding junction pads 13 on the suspender 8. This connection is made, for example, by solder 17. This solder 17 can be selectively formed on junction pads 13-1 of the film tape 15 by electro chemical plating process or by screen print method. Also, on the junction pads 13 on the film carrier tape 1, the solder 17 can be selectively formed.

Figure 5:
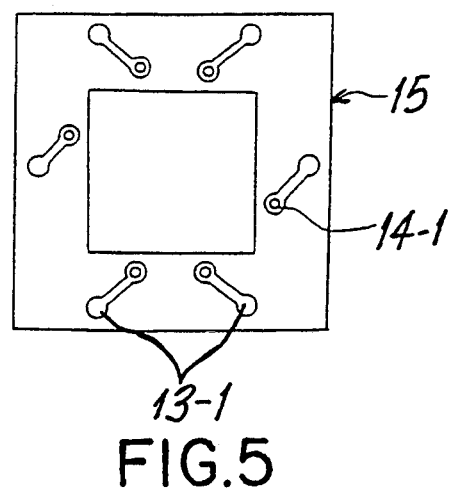
FIG. 5 shows a modification of FIG. 4C.

FIG. 5 shows a modification of the embodiment shown in FIG. 4C. In this modification, a junction pad 13-1 is displaced to a different position from the corresponding through hole 14-1. As the position of the junction pad 13-1 is determined by the position of the corresponding junction pad 13 on the suspender 8, the positions of through holes 14-1 in FIG. 5 can be selected with larger freedom.

In connecting these junction pads 13-1 to junction pads 13, the multi-metal-layer film tape 15 is mounted on the film carrier tape 1, with the position of the multi-metal-layer film tape 15 aligned to the suspender 8, and is inserted in an oven to melt the solder 17.

When the solder paste is selectively formed on the junction pads 13-1 by a screen printing method, the adhesive force of the solder paste can temporarily fix the position of the multi-metal-layer film tape 15. This temporary fixing facilitates the handling. In case when the adhesive force of the solder paste is not sufficient, the transitory position fixing is made by adhesives. In order to avoid the adhesives from covering the junction pads 13-I, the adhesives must be dripped little by little from accurate positions, or the adhesives must be transcripted to a predetermined area by a rubber stamp. A screen printing of adhesives or sheet-formed adhesives may also be used for this purpose.

After the multi-metal-layer film tape 15 is connected to the film carrier tape 1, the semiconductor chip 2 is tested. In this test, the film carrier tape 1 is positioned, and test probes of a measuring equipment come to contact to corresponding test pads.

After the test of the chip 2, the chips 2 which are not rejected at the test are mounted on a printed circuit board for actual service.

The method of mounting is similar to a conventional method of mounting, and will be briefly described.

Figure 6:
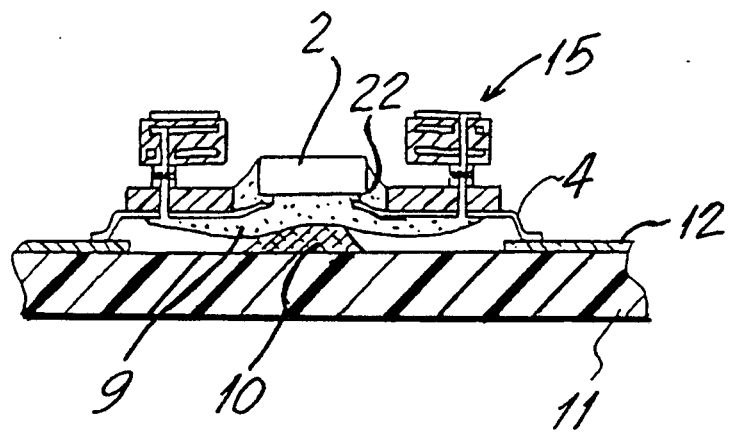
FIG. 6 is a cross sectional view illustrating OLB of this invention.

FIG. 6 is a cross sectional view illustrating the mounting of the chip 2 to a printed circuit board 11.

The lead conductors 4 are cut off at the OLB lead holes 20, and the chip 2 is fixed to the printed circuit board 11 by an adhesive 10 via the sealing resin 9. And the lead conductors 4 are connected to corresponding printed circuits 12.

In a heretofore known TAB semiconductor device, as the lead conductors 4 are supported only by the suspender 8 which has a weak rigidity, the lead conductors 4 were liable to deformation, and must be pressed to the surface of the printed circuit 12 during the OLB. This required a special bonding tool.

In the configuration shown in FIG. 6, the multi-metal-layer film tape 15 reinforces the rigidity of the suspender 8, and prevents the deformation of the lead conductors 4.

Figure 7:
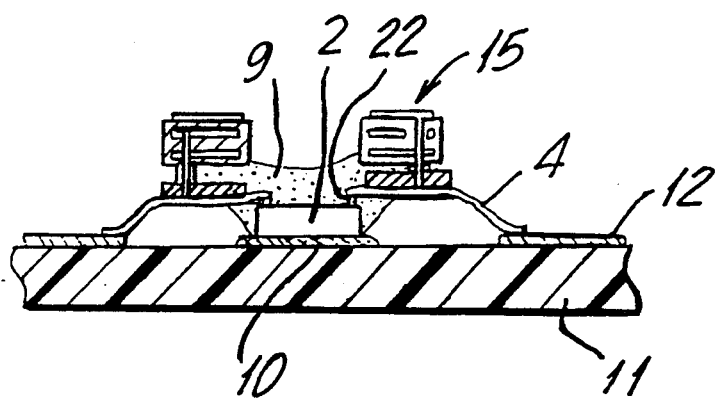
FIG. 7 shows a modification of FIG. 6.

In the embodiment shown by FIG. 6, the face of the chip 2, that is the surface having bumps 22, faces downward to the printed circuit board 11. When the chip 2 is connected below the lead conductors 4 in the ILB, the back of the chip 2 faces to the printed circuit board as shown in FIG. 7.

Figure 8:
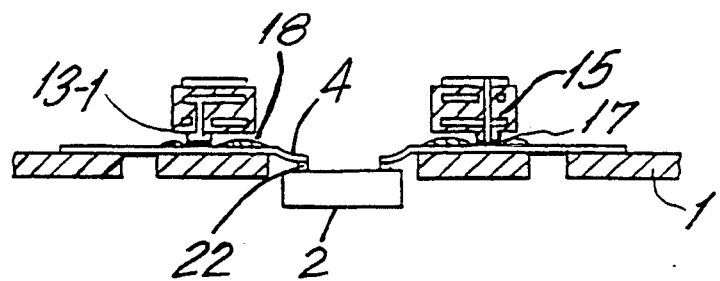
FIG. 8 is a cross sectional view illustrating another embodiment of this invention.

In a second embodiment shown by FIG. 8, after the ILB, the junction pads 13-1 of the multi-metal-layer film tape 15 are directly connected to corresponding leads 4 by solder 17. In this connection, it is desirable that the corresponding leads 4 are provided with bumps facing to the corresponding pads 13-1, and that other parts are covered by solder resist 18 for protection of short circuit.

Figure 9:
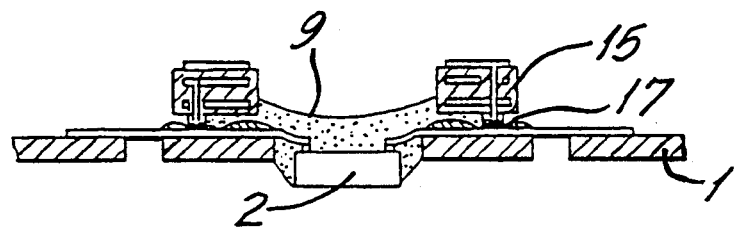
FIG. 9 is a cross sectional view of a resin-seal of the device shown in FIG. 8.

In this embodiment, the resin-sealing of the chip 2 is carried out after the mounting of the multi-metal-layer film tape 15, as shown in FIG. 9. In this sealing process, the multi-metal-layer film tape 15 may be utilized as a resin dam for preventing the flow out of the liquid state resin. The liquid state resin may flow in the space between the multi-metal-layer film tape 15 and the suspender 8. As the space is very thin, the flow out of the resin is prevented by a surface tension.

When adhesives are used for transitory fixing of the multi-metal-layer film tape 15, the adhesives can prevent the resin flow out.

Figure 10:
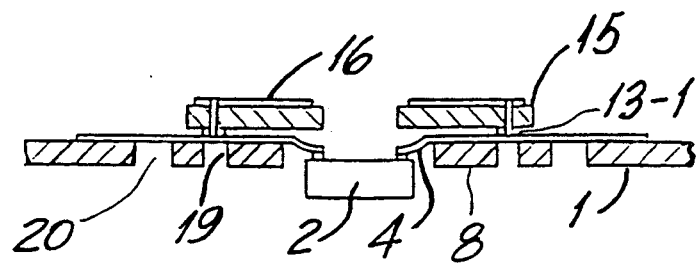
FIG. 10 is a cross sectional view illustrating a modification of the process shown in FIG. 8.

A third embodiment of this invention is shown in FIG. 10, where there is a slit 19 in the suspender 8 for inserting a head of a bonding tool. The bonding can be made by thermo compressive wire bonding, by eutectic alloy die bonding, and by ultra sonic bonding. The junction pads 13-1 of the multi-metal-layer film tape are bonded to the corresponding lead conductors 4, and the slit 19 (or it may be a group of holes) is so arranged as all the bonding spots are accessible by the head of the bonding tool through the slit 19.

In order to obtain a reliable bonding, the surfaces of the junction pads 13-1 are plated by Au or Sn in accordance with the bonding method.

It must be noted that the dimension of the multi-metal-layer film tape 15 in the plan view is not limited by the dimension of the suspender 8. In the embodiment shown in FIG. 10, the multi-metal-layer film tape 15 is extended beyond the inner limit of the suspender 8. When the multi-metal-layer film tape is extended beyond the outer limit of the suspender 8, a ring-shaped multi-metal-layer film tape outside of the OLB lead holes 20 (not shown in the drawing) and a ring-shaped multi-metal-layer film tape 15 on the suspender 8 may be connected by the four tie bars 21.

In the embodiment shown in FIG. 10, there is provided only one conductor layer 18. This configuration is equivalent to the heretofore known two-metal-tape film, and this means that an equivalent circuit of the two-metal-tape film can be easily achieved by this invention.

The multi-metal-layer film tape 15 may be further simplified to a single metal sheet connected to grounding leads 4-1. In this embodiment, the solder resist 18 on the metal sheet and on the other leads 4 prevents short circuiting.

Figure 11:
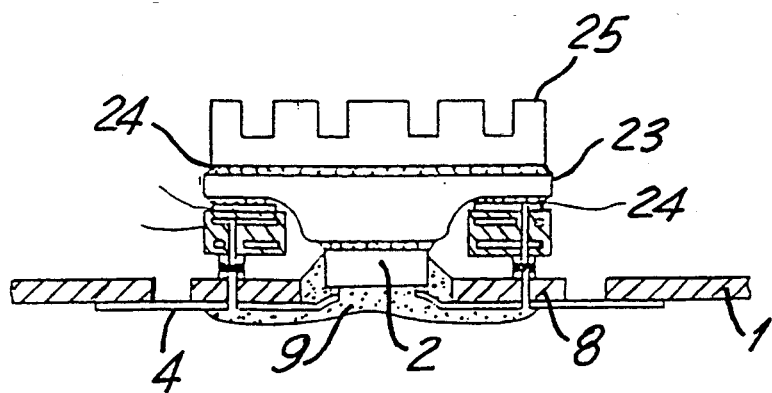
FIG. 11 is a cross sectional view illustrating another embodiment of the invention.

In a fourth embodiment of this invention which is shown in FIG. 11, a cap 23 is adhered to the multi-metal-layer film tape 15 and to the back of the chip 2 by adhesives 24. Further, a heat sink 25 is adhered to the cap 23 by adhesives 24. When the adhesives 24 are made of a conducting material, for example of Ag paste or solder, the back of the chip 2 is connected to the grounding conductor layer 16-1.

The cap 23 and the heat sink 25 may be integrated, or these parts may be mounted after the TAB semiconductor device is installed on a circuit board.

The cap 23 and the heat sink 25 can also be mounted when the back of the chip 2 faces to the printed circuit board 11 as shown in FIG. 7. When the back of the chip 2 is to be grounded, however, a circuit for grounding the back of the chip 2 must be specially provided in the configuration shown by Fig.

I claim:

1. A tape automated bonding (TAB) semiconductor device comprising:
   a longitudinally extending film carrier tape (1) made of an insulating film having positioning sprocket holes (6), and
   an array of plural assembly sets of;
   each assembly set including;
   a device hole (3) provided in said carrier tape for housing a semiconductor chip (2) having a plurality of bumps (22),
   a set of outer lead holes (20) provided in said carrier tape and surrounding said device hole,
   a suspender (8) of an insulator frame formed on said carrier tape between said device hole and said set of outer lead holes,
   a plurality of lead conductors (4) formed on carrier said tape and supported by said suspender, each lead conductor having a first end portion bonded to an associated one of said bumps of said chip land a second end portion,
   a multi-metal-layer film tape (15) having at least one conductor layer (16) and fixed on said suspender,
   connecting means (13, 14, 17) for connecting a predetermined lead conductor to said at least one conductor layer of said multi-metal-layer film tape, and
   a set of test pads (5) each being provided on said carrier tape at said second end portion of an associated one of said lead conductors for testing electrical properties of said chip.

2. The semiconductor device of claim 1, wherein said multi-metal-layer film tape comprises at least a grounding conductor layer (16-1) and a power supply conductor layer (16-2).

3. The semiconductor device of claim 1, wherein said multi-metal-layer film tape comprises two parallel grounding conductors layers (16-1) and a power supply conductor layer (16,2) sandwiched between said two parallel grounding conductor layers.

4. The semiconductor device as claimed in claim 2, wherein said bumps of said chip include a grounding bump and a power supply bump, and said lead conductors include a grounding lead conductor (4-1), connected to said grounding bump at said first end portion thereof and also to said grounding conductor layer (16-1), and a power supply lead conductor (4-2), connected to said power supply bump at said first end portion thereof and also to said power supply conductor layer (16-2).

5. The semiconductor device as claimed in claim 4, wherein said lead conductors further include a plurality of additional grounding lead conductors and a plurality of additional power supply lead conductors, each additional lead conductor having a first end portion and a second end portion, one of said grounding lead conductors and said additional grounding lead conductors being connected to an associated one of said test pads at said second end portion thereof and one of said power supply lead conductors and said additional power supply lead conductors being connected to an associated one of said test pads at said second end portion thereof.

6. The semiconductor device as claimed in claim 1, wherein said connecting means (13, 14, 17) comprise a first junction pad (13) provided on a surface of said suspender opposite to said plurality of lead conductors, a second junction pad (13-1) provided on a bottom surface of said multi-metal-layer film tape (15), a through connection (14) connecting said second junction pad to said predetermined one of said lead conductors, said second junction pad (13-1) provided on said bottom surface of said multi-metal-layer film tape being connected to said at least one conductor layer, and bonding means (17) for bonding said first junction pad to said second junction pad.

7. The semiconductor device as claimed in claim 1, wherein said connecting means (13, 14, 17) comprise a junction pad (13-1) provided on a bottom surface of said multi-metal-layer film tape and connected to said at least one conductor layer (16), and bonding means (17) for bonding said junction pad to said predetermined one of said lead conductors.

8. The semiconductor device of claim 1, wherein said multi-metal-layer film tape has a plan surface similar to that of said suspender.

9. The semiconductor device of claim 1, wherein said multi-metal-layer film tape is further provided with a conductor cap (23) on top of said multi-metal-layer film tape.

10. The semiconductor device of claim 9, wherein said cap is fixed on said top of said multi-metal-layer film tape and on a bottom surface of said chip by conductive adhesives, grounding said bottom surface of said chip through said at least one conductor layer of said multi-metal-layer film tape.

11. The semiconductor device of claim 9, wherein a heat sink is mounted on said cap.

* * * * *